US009099397B1

(12) United States Patent
Li

(10) Patent No.: US 9,099,397 B1
(45) Date of Patent: Aug. 4, 2015

(54) FABRICATION OF SELF ALIGNED BASE CONTACTS FOR BIPOLAR TRANSISTORS

(75) Inventor: James Chingwei Li, Simi Valley, CA (US)

(73) Assignee: HRL Laboratories, LLC, Malibu, CA (US)

( * ) Notice: Subject to any disclaimer, the term of this patent is extended or adjusted under 35 U.S.C. 154(b) by 290 days.

(21) Appl. No.: 13/427,097

(22) Filed: Mar. 22, 2012

(51) Int. Cl.
| | | |
|---|---|---|
| H01L 21/306 | (2006.01) |
| H01L 21/265 | (2006.01) |
| H01L 21/285 | (2006.01) |
| H01L 29/70 | (2006.01) |
| H01L 27/102 | (2006.01) |
| H01L 31/11 | (2006.01) |

(52) U.S. Cl.
CPC ............ *H01L 21/306* (2013.01); *H01L 21/265* (2013.01); *H01L 21/285* (2013.01); *H01L 27/102* (2013.01); *H01L 29/70* (2013.01); *H01L 31/11* (2013.01)

(58) Field of Classification Search
CPC ... H01L 21/306; H01L 21/265; H01L 21/283; H01L 21/203
See application file for complete search history.

(56) References Cited

U.S. PATENT DOCUMENTS

| | | | |
|---|---|---|---|
| 5,316,957 A * | 5/1994 | Spratt et al. ................... 438/311 |
| 5,508,552 A * | 4/1996 | Iranmanesh et al. .......... 257/571 |
| 5,729,033 A * | 3/1998 | Hafizi ............................ 257/198 |
| 2005/0045911 A1* | 3/2005 | Hill et al. ....................... 257/192 |

\* cited by examiner

*Primary Examiner* — David Vu
*Assistant Examiner* — Mouloucoulaye Inoussa
(74) *Attorney, Agent, or Firm* — Ladas & Parry

(57) ABSTRACT

A transistor includes a first emitter layer area, a second emitter layer area, wherein the second emitter layer area is separate from the first emitter layer area, a first metal formed on the first emitter layer area, a second metal formed on the second emitter layer area, a base, and a base metal formed on the base and on the second metal. The first emitter layer area is an emitter of the transistor and the first metal provides an emitter contact. The base metal on the base and on the second metal provides a base contact.

14 Claims, 5 Drawing Sheets

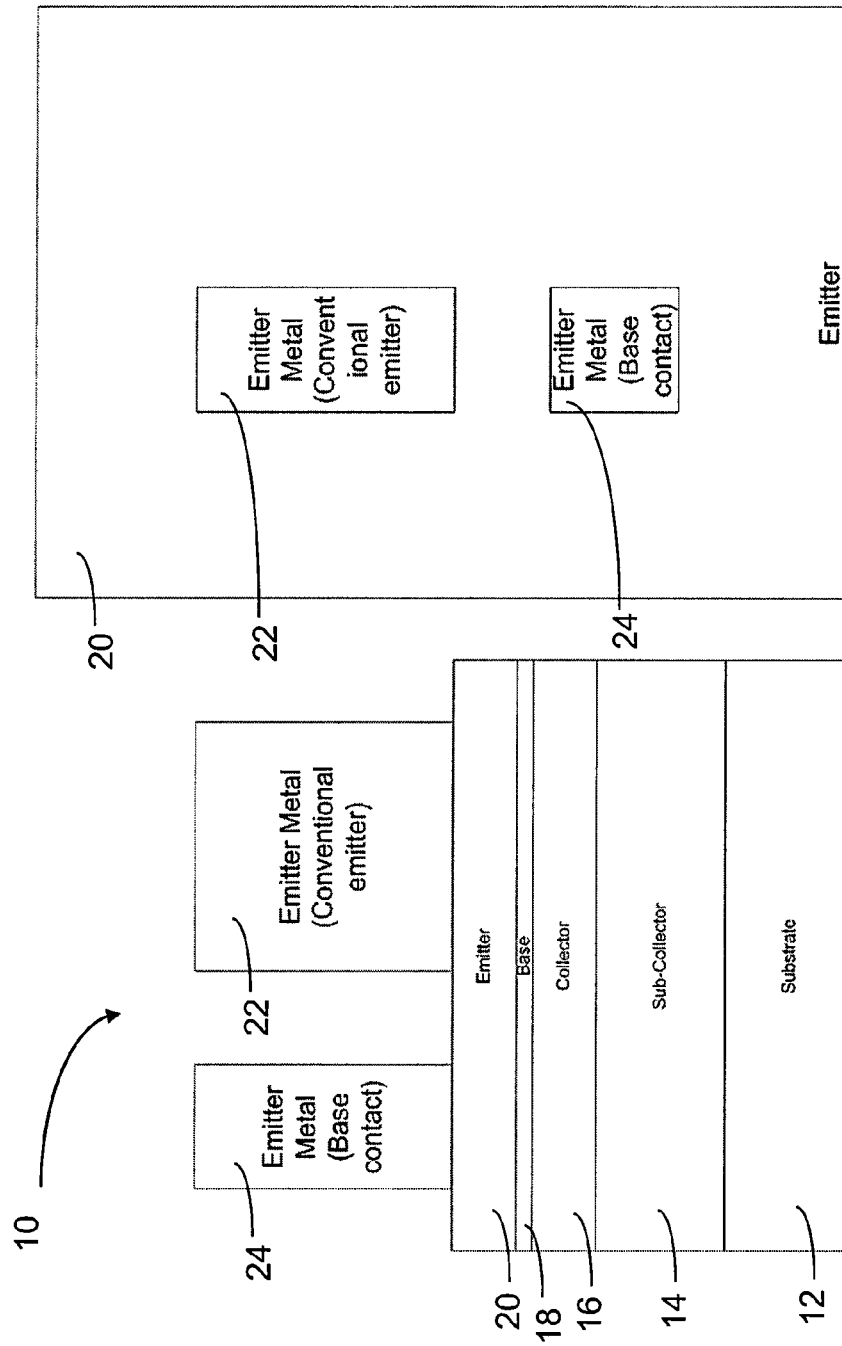

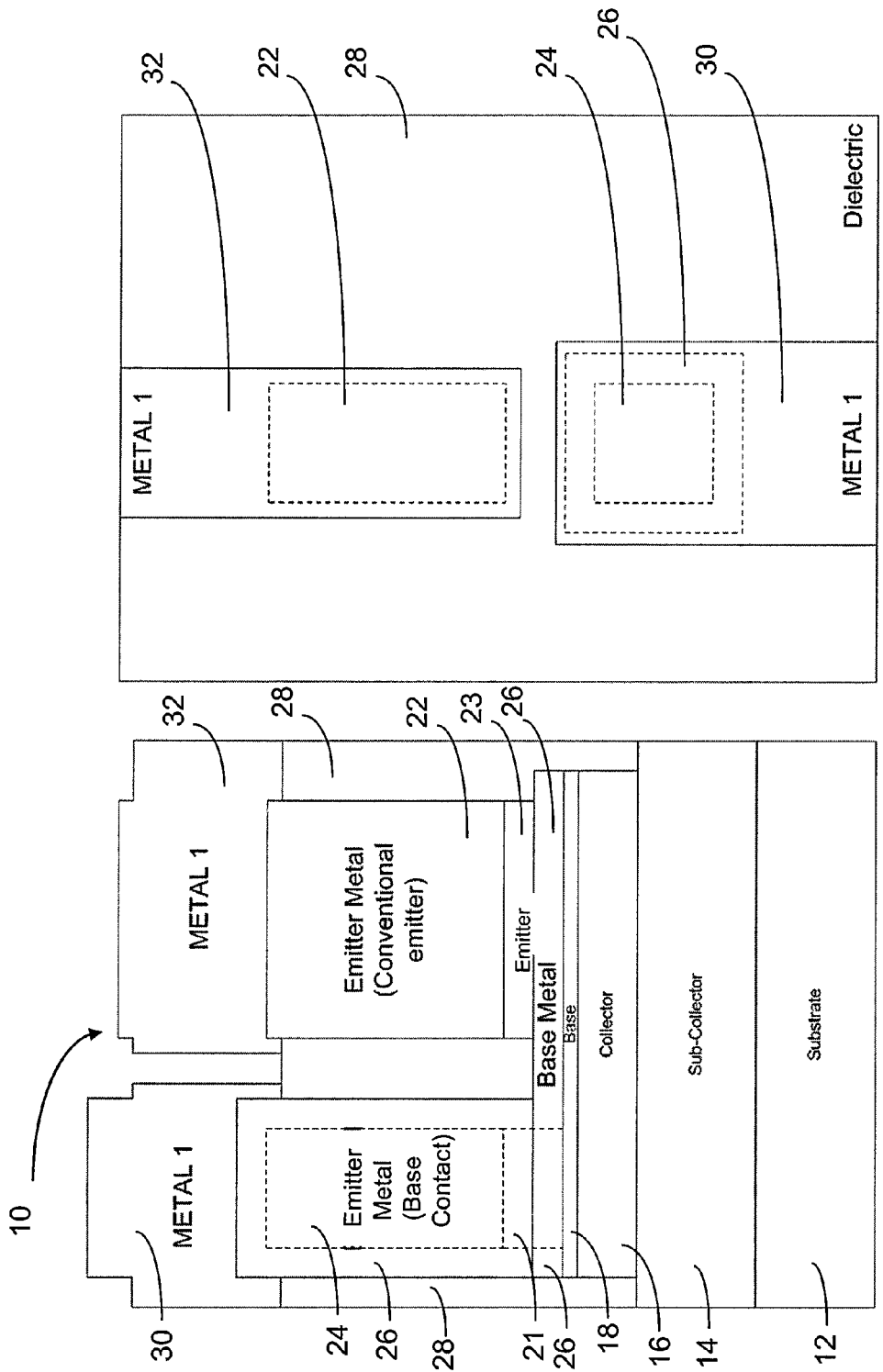

FABRICATION OF SELF ALIGNED BASE CONTACTS FOR BIPOLAR TRANSISTORS

CROSS REFERENCE TO RELATED APPLICATIONS

None

TECHNICAL FIELD

This disclosure relates to bipolar transistor fabrication and in particular to the fabrication of base contacts for bipolar transistors.

BACKGROUND

Using separate lithography steps in the formation of the emitter, extrinsic base or base metal, and base contact requires that all these features be controlled precisely to assure that the alignment between these features is acceptable. In order to maintain acceptable alignment, considerable investment must be made in semiconductor processing equipment and/or the alignment tolerance must be increased. Any needed increase in alignment tolerance results in larger transistor features sizes, and degrades some element of the transistor performance.

Separate process steps used in the formation of the emitter, extrinsic base or base metal, and base contacts also requires several additional lithography and deposition steps. This adds both time and money to already expensive, high performance process technologies. Additional process steps also increase the net yield loss of a given process technology.

The following describes two prior art methods for the formation of base contacts.

I. Aligned Base Post

This method uses a lithography step to define the location of a metallic post directly on the extrinsic base or base metal and align the metallic post to the emitter. The post location is then metalized to create a free-standing metallic pillar or post that will make electrical contact between the extrinsic base or base metal and the first global level of interconnect. This method is common for InP and GaAs heterojunction bipolar transistor (HBT) process technologies.

The disadvantages of this method include the following.

A. The need for a separate lithography step to form the base contact requires a critical alignment between the emitter and base contact. The failure of the critical alignment may result improper electrical contact from the first global interconnect level and the extrinsic base or base metal; electrical shorts between the transistor base and collector; and other yield loss mechanisms.

B. The need for a base post of dimensions greater than the emitter geometry to minimize yield loss. The base post height is equal to the difference between the emitter and base metal top surfaces which is larger than the emitter metal height. By definition, the post must be of a larger geometric size than the emitter.

C. The need to maintain a large extrinsic base or base metal contact area for the already large post. This results in higher than desired parasitic capacitance and degraded transistor performance.

The need for separate lithography and processing steps to form the base contact increases processing time, complexity, and cost. For example, aligned base post formation may require 2-5 business days.

II. Aligned Base Via

This method uses a lithography step to define the location of a metallic via on the extrinsic base or base metal and align the metallic via to the emitter. The via location is then etched and metalized to create an electrical contact from the first global interconnect level through the first planarizing or passivating dielectric to the extrinsic base or base metal. This method is used by some InP and GaAs HBT process and is common for Si BJT and SiGe HBT process technologies. IBM has used this method to form base contacts for silicon bipolar junction transistor (BJT) and SiGe HBT process technologies.

The disadvantages of this method include the following.

A. The need for a separate lithography step to form the base via requires a critical alignment between the emitter and base contact. The failure of the critical alignment may result improper electrical contact from the first global interconnect level and the extrinsic base or base metal; electrical shorts between the transistor base and collector; electrical shorts between the base and emitter; and other yield loss mechanisms.

B. The need for a base via of dimensions greater than the emitter geometry to minimize yield loss. The base via depth is equal to the difference between the emitter and base metal top surfaces which is larger than the emitter metal height. By definition, the via must be of a larger geometric size than the emitter. Any via corner rounding resulting from poor lithography or etch only further exacerbates this problem.

C. The need to maintain a large extrinsic base or base metal contact area for the already large via. This results in higher than desired parasitic capacitance and degraded transistor performance.

D. The need for separate lithography and processing steps to form the base contact increases processing time, complexity, and cost.

Both prior art methods of base contact formation involve a critical alignment, increased processing time, increased equipment investment costs, and increased processing costs. What is needed is a method of forming a self aligned base contact that requires substantially less critical alignment, less processing time, less equipment investment costs, and less processing costs. Also needed is a method for forming self aligned base contacts that improves processing yield. The embodiments of the present disclosure answer these and other needs.

SUMMARY

In a first embodiment disclosed herein, a transistor comprises a first emitter layer area, a second emitter layer area, wherein the second emitter layer area is separate from the first emitter layer area, a first metal formed on the first emitter layer area, a second metal formed on the second emitter layer area, a base, and a base metal formed on the base and on the second metal, wherein the first emitter layer area is an emitter of the transistor and the first metal provides an emitter contact and wherein the base metal on the base and on the second metal provides a base contact.

In another embodiment disclosed herein, a method of forming a self aligned base contact for a transistor comprises forming a first metal on a first emitter area of an emitter layer of the transistor, forming a second metal on a second emitter area of the emitter layer of the transistor, etching the emitter layer to separate the first emitter area from the second emitter area, and to expose a base of the transistor, and depositing base metal on the base and on the second metal, wherein the first emitter area is an emitter of the transistor and the first metal provides an emitter contact, and wherein the base metal on the base and on the second metal provides a base contact.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIGS. 1A and 1B show a side and a top view, respectively, for the step of deposition of emitter metal in accordance with the present disclosure;

FIGS. 4A and 4B show a side and a top view, respectively, for the step of fabrication of interconnect metal in accordance with the present disclosure.

DETAILED DESCRIPTION

Figures 2A, 2B:
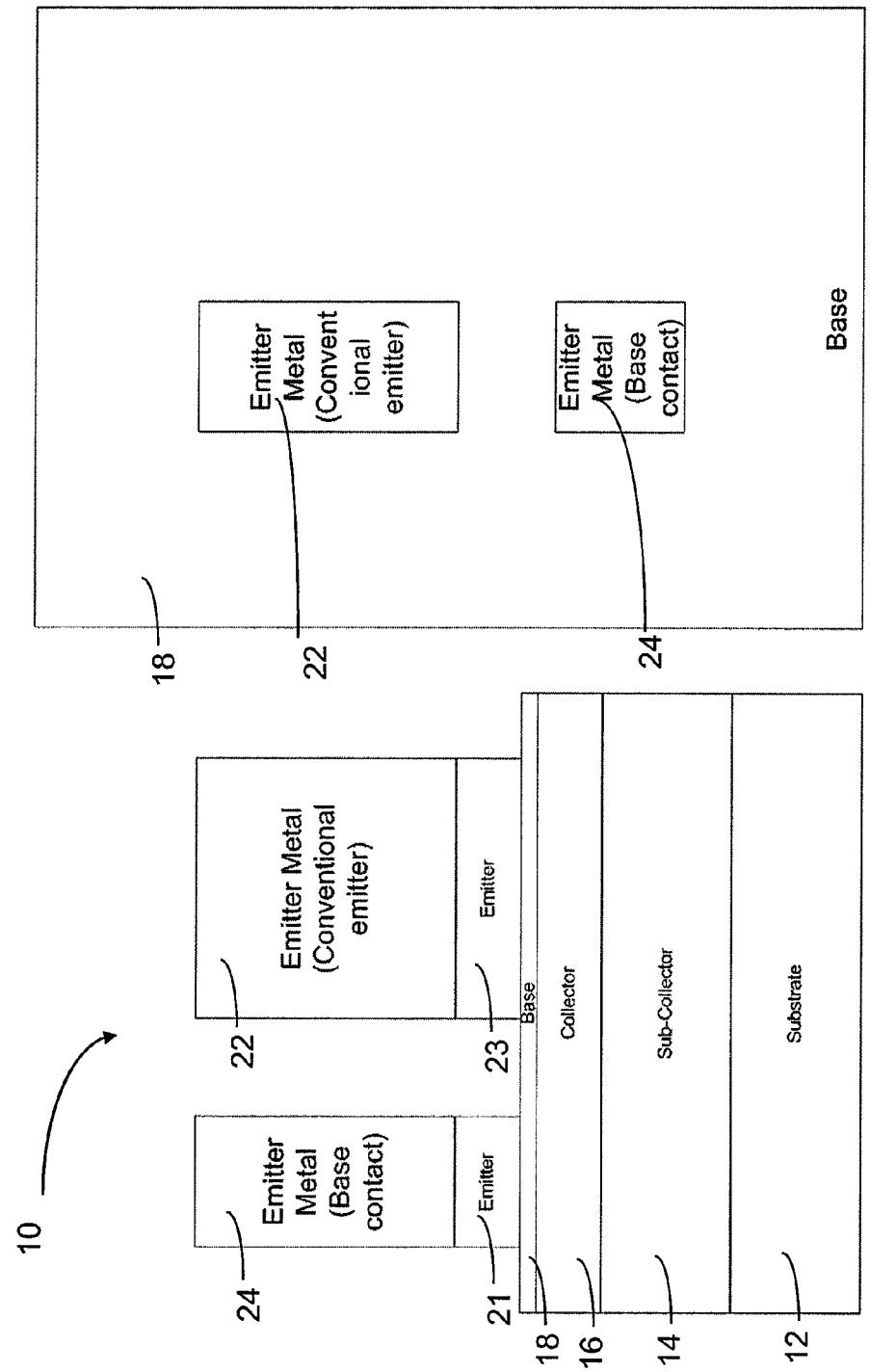
FIGS. 2A and 2B show a side and a top view, respectively, for the step of etching of the emitter in accordance with the present disclosure.

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

FIGS. 1-4 show the steps of a process for the fabrication of self aligned base contacts for InP and GaAs HBTs; however, the methods are not limited to those technologies and those skilled in the art will understand that the fabrication methods may be adapted for other bipolar transistor process technologies.

FIG. 1A is a side elevation view of the transistor 10 and FIG. 1B is a top view of the transistor 10. As shown in FIGS. 1A and 1B, a transistor 10 is fabricated on a substrate 12. Above the substrate 12 a sub-collector 14, collector 16, base 18, and emitter 20 layers are fabricated by processes well known in the art. A person skilled in the art will recognize that a bipolar transistor has at least a collector, base and emitter. Features such as a sub-collector are optional. The substrate 12 may be silicon, InP or GaAs.

Emitter metal 22 and 24 are deposited onto the emitter 20 surface, as shown in FIGS. 1A and 1B. The emitter metal 22 and 24 may be fabricated through an additive process such as involving image reverse lithography, metal evaporation, sputtering, lift-off process, or electro-plating, or a subtractive process which may include a blanket metal deposition, etch mask definition by lithography, and an emitter metal etch. As shown in FIGS. 1A and 1B, a first emitter metal 22 is fabricated on one area of the emitter 20 to form a conventional emitter contact 22, and a second emitter metal 24 is formed on a second area of the emitter 20, which will be used to form a base contact, as further described below. The emitter metal 22 and 24 may be fabricated simultaneously to eliminate extra processing steps. The shapes of the first emitter metal 22 and the second emitter metal 24 may be identical, or may differ in relative size. In one embodiment the second emitter metal 24 may be smaller in size than the first emitter metal 22. By using emitter metal to define both a conventional emitter contact 22 and a base contact, the base contact may be self-aligned to the emitter contact.

FIGS. 2A and 2B, are side elevation view and top view of the transistor 10, respectively, after an emitter etch. The emitter 20 may be etched with dry etch, wet etch, or a combination of dry and wet etch processes. In this step, the etching process of the emitter 20 may be identical and simultaneously performed to etch the emitter 20 around first emitter metal 22 and for the emitter 20 around the second emitter metal 24. After etching, the emitter layer area 23 below the first emitter metal 22 is the actual emitter for the transistor 10, while the emitter layer area 21 below the second emitter metal 24 is not used as the emitter for the transistor 10, and is not connected to emitter 23, as further described below.

Figures 3A, 3B:
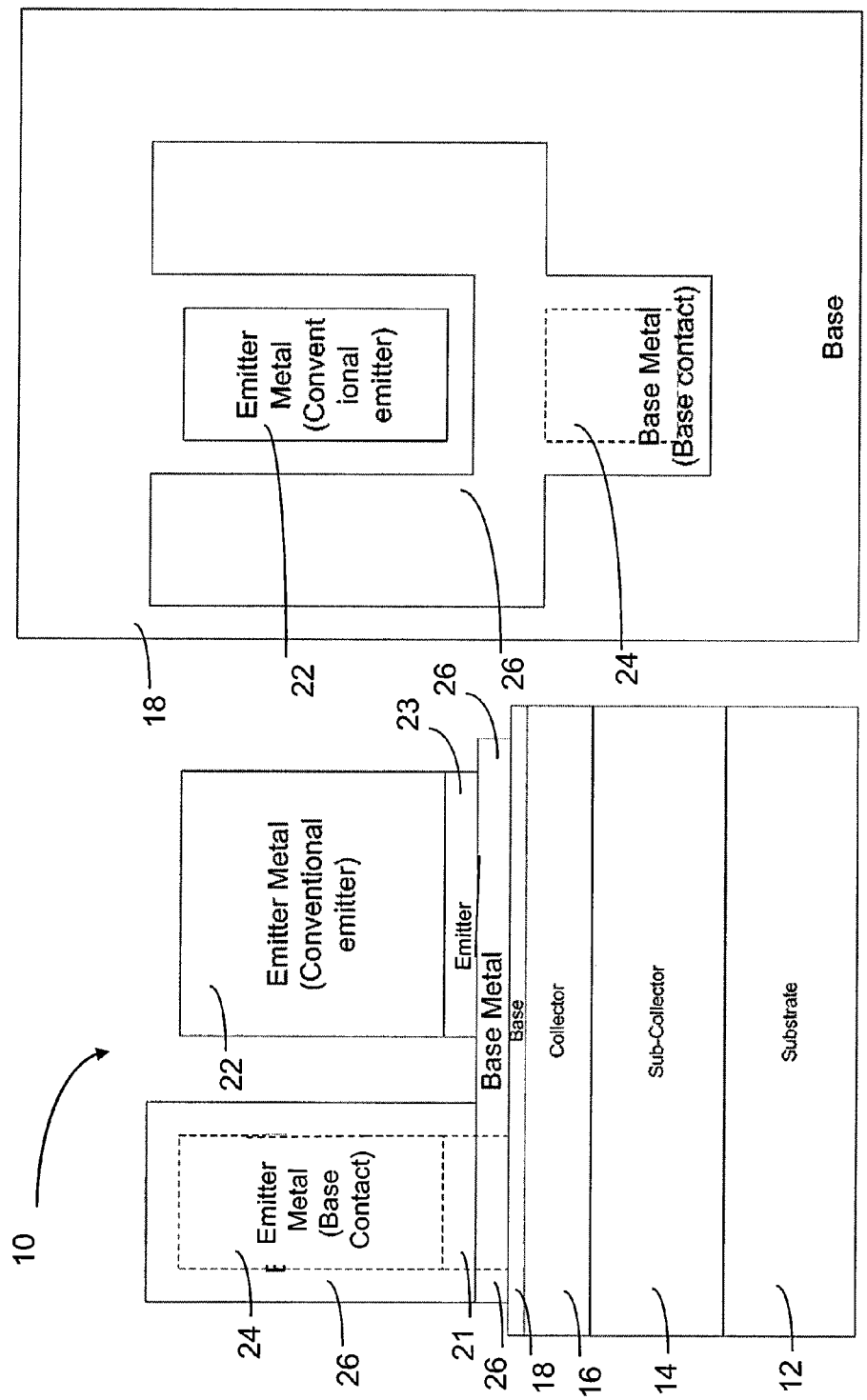
FIGS. 3A and 3B show a side and a top view, respectively, for the step of deposition of base metal in accordance with the present disclosure.

Next, as shown in FIGS. 3A and 3B, which are side elevation and top views of the transistor 10, respectively, base metal 26 is deposited. Before depositing the base metal, the first emitter metal 22 and the emitter 23 may be covered with a dielectric sidewall. The base metal 26 may be fabricated through a additive process involving an image reverse lithography, metal evaporation, lift-off process, or electro-plating, or a subtractive process involving a blanket metal deposition, etch mask definition by lithography, and a base metal etch. The base metal 26 is deposited to cover the second emitter metal 24 and is deposited directly on the base 18. The base metal 26, which is for the base contact, may completely overlap and cover the second emitter metal 24, which is shown in FIGS. 3A and 3B as a dotted line, because the emitter metal area is covered and hidden from view by the base metal 26. As shown best in FIG. 3B, the base metal 26 does not overlap or come in close proximity to the first emitter metal 22 or the emitter layer area 23. Therefore, there is no electrical short between the emitter layer area 23 and the base metal 26.

As shown in FIG. 3B, the base metal 26 formed on the base 18 may partially surround the emitter layer area 23; however, the base metal 26 is not connected to the emitter layer area 23. In FIG. 3B, the base metal 26 is formed on three sides of the emitter layer area 23. The base metal may also completely surround the emitter layer area 23 however, again, the base metal 26 is not connected to the emitter layer area 23.

The base metal 26 is considered to be non-self-aligned to the first emitter metal 22 for the conventional emitter contact, and considered to be self-aligned to the second emitter metal 24.

In some prior art HBT processes, a shadow self aligned base metal is used to reduce the parasitic resistance between the conventional emitter and the base contact; however, this results in poor yield with base-emitter shorts as the predominant failure mechanism. In the present disclosure, by purposely creating a short between the second emitter metal 24 and the base metal 26, a low resistance path is created from the top of the second emitter metal 24 to the base metal 26, and thereby to the base 18.

The remainder of the processing of transistor 10 is well known in the industry. The collector 16 and base 18 layers may be etched to form a mesa, as shown in FIG. 4A. Then dielectric 28 is deposited over the mesa. After the dielectric 28 is deposited, a portion of the dielectric 28 is removed so that the base metal 26 on top of the second emitter metal 24 is exposed and not covered by the dielectric 28. The top of the first emitter metal 22 is also left exposed and not covered by the dielectric 28, as shown in FIG. 4A.

Then, first interconnect metal (METAL 1) is deposited to electrically contact the transistor to neighboring devices to form integrated circuits. As shown in FIGS. 4A and 4B, emitter contact metal 32 makes contact to the conventional first emitter metal 22. The base contact is separately made by base contact metal 30 which connects to base metal 26, which, as described above, covers the second emitter metal 24. Generally, the base contact metal 30 is not connected to emitter contact metal 32; however, the emitter and base may be connected for some circuit configurations.

Figure 5:
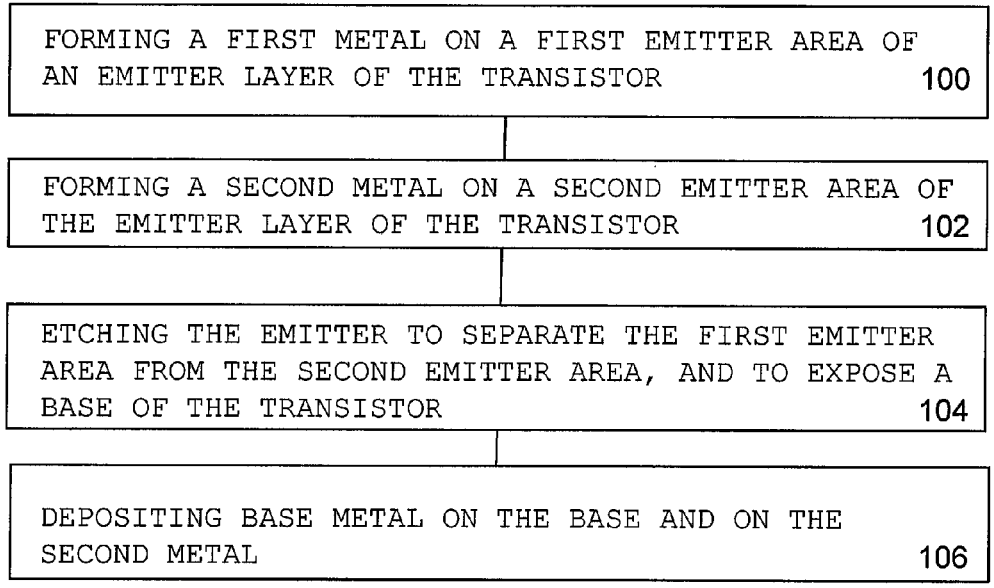
FIG. 5 is a flow diagram of a method of fabricating self aligned base contacts in accordance with the present disclosure.

FIG. 5 is a flow diagram of a method of forming a self aligned base contact for a transistor. In step 100 a first metal 22 is formed on a first emitter area of an emitter layer 20 of the transistor. Then in step 102 a second metal 24 is formed on a second emitter area of the emitter layer 20 of the transistor. Steps 100 and 102 may be performed simultaneously. Next in step 104 the emitter layer 20 is etched to separate the first emitter area 23 from the second emitter area 21, and to expose a base 18 of the transistor. Then in step 106 base metal 26 is deposited on the base 18 and on the second metal 24.

By the above process a self aligned base contact is formed that requires substantially less critical alignment, less processing time, less investment in semiconductor processing equipment and less processing cost. The self aligned base contact process also improves processing yield.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A method of forming a self aligned base contact for a transistor, the method comprising:
   forming a collector layer on a substrate;
   forming a base layer on the collector layer;
   forming an emitter layer on the base layer;
   forming a first metal on a first emitter area of the emitter layer of the transistor;
   forming a second metal on a second emitter area of the emitter layer of the transistor, wherein the first metal and the second metal are not in direct physical contact;
   etching the emitter layer to remove the emitter layer surrounding the first emitter area, wherein the first emitter area is masked by the first metal, and to remove the emitter layer surrounding the second emitter area, wherein the second emitter area is masked by the second metal, so that the base layer is exposed surrounding the first emitter area and the second emitter area; and
   depositing base metal on the base layer, on the second metal, over sides of the second metal, and over sides of the second emitter area, so that the base metal on the base layer, the base metal on the second metal, the base metal over sides of the second metal, and the base metal over sides of the second emitter area are in contact with each other;
   wherein the first emitter area is an emitter of the transistor and the first metal provides an emitter contact; and
   wherein the base metal provides a base contact; and
   wherein the base metal is not in direct physical contact with the first metal or the first emitter area.

2. The method of claim 1 wherein:
   the steps of forming the first metal on the first emitter area of the emitter layer of the transistor and forming the second metal on the second emitter area of the emitter layer of the transistor are performed simultaneously.

3. The method of claim 1 further comprising:
   etching the base layer and the collector layer of the transistor to form a mesa.

4. The method of claim 1 wherein the step of etching comprises a wet etch, a dry etch, or a combination of a wet and dry etch.

5. The method of claim 1 further comprising:
   depositing a dielectric over the base layer, the base metal, the first metal on the first emitter area, and the second metal on the second emitter;
   etching the dielectric to expose a top of the first metal and to expose a top of the base metal on the second metal;
   depositing emitter contact metal on the first metal to form a transistor emitter contact; and
   depositing base contact metal on the base metal to form a transistor base contact.

6. The method of claim 1 wherein the base metal completely covers the second metal.

7. The method of claim 1 wherein:
   the base metal formed on the base layer at least partially surrounds the first emitter area; and
   wherein the base metal is not in direct physical contact with the first emitter area.

8. The method of claim 7 wherein the base metal formed on the base layer is on three sides of the first emitter area.

9. The method of claim 1 wherein:
   the base metal formed on the base layer completely surrounds the first emitter layer area; and
   wherein the base metal is not in direct physical contact with the first emitter layer area.

10. The method of claim 1 wherein the transistor is a bipolar junction transistor, an InP heterojunction bipolar transistor (HBT), or an GaAs HBT.

11. The method of claim 1 wherein the second emitter area is the same as or smaller in size than the first emitter area.

12. The method of claim 1 wherein:
the first metal and the second metal are formed through an additive process comprising image reverse lithography, metal evaporation, a lift-off process or electro-plating, or a subtractive process comprising blanket metal deposition, etch mask definition by lithography, and an emitter metal etch.

13. The method of claim 1 wherein:
the base metal is formed through an additive process comprising image reverse lithography, metal evaporation, a lift-off process, or electro-plating, or a subtractive process comprising blanket metal deposition, etch mask definition by lithography, and a base metal etch.

14. The method of claim 1 wherein depositing base metal on the base and on the second metal further comprises forming a dielectric on sides of the first emitter area and the first metal prior to depositing the base metal.

\* \* \* \* \*